United States Patent [19]

Nolde

[11] Patent Number: 4,658,423
[45] Date of Patent: Apr. 14, 1987

[54] FM-STEREO RECEIVER

[75] Inventor: Wolfgang Nolde, Hamburg, Fed. Rep. of Germany

[73] Assignee: U.S. Philips Corporation, New York, N.Y.

[21] Appl. No.: 684,443

[22] Filed: Dec. 21, 1984

[30] Foreign Application Priority Data

Dec. 21, 1983 [DE] Fed. Rep. of Germany ....... 3346059

[51] Int. Cl.$^4$ ............................................. H04H 5/00
[52] U.S. Cl. ..................................... 381/13; 329/123; 329/130
[58] Field of Search ............................ 381/4, 2, 3, 13; 329/123, 124, 130

[56] References Cited

U.S. PATENT DOCUMENTS 4,300,020 11/1981 Toyomaki ............................... 381/4
4,502,148 2/1985 Ishida et al. ........................... 381/4
4,523,328 6/1985 Kasperkovitz ......................... 381/4

Primary Examiner—Forester W. Isen
Attorney, Agent, or Firm—Thomas A. Briody; William J. Streeter; Marianne R. Rich

[57] ABSTRACT

In an FM-stereo receiver the demodulated stereo-difference signal is mixed with a non-sinusoidal signal of the sub-carrier frequency and the mixing product is used to modulate the frequency of an oscillator by means of which the aerial signal is converted to the intermediate frequency range. Interference in the reception is avoided because of the fact that the signal used for modulating the oscillator is free from third and fifth harmonics of the sub-carrier frequency.

5 Claims, 10 Drawing Figures

FM-STEREO RECEIVER

The invention relates to an FM-stereo receiver comprising an oscillator whose frequency is controlled in dependence on a signal applied to a control input, a mixer stage mixing the oscillator signal with a radio-frequency input signal forming an IF-signal, and an FM-demodulator to which the IF-signal is applied. The FM demodulator MPX output signal is applied to the control input of the oscillator through a first low-pass filter and also through a bandpass filter. The bandpass filter comprises in a demodulator for generating a stereo-difference signal on reception of a stereo transmission, and is followed by a second low-pass filter whose output signal is mixed in a first mixer with a non-sinusoidal signal of the sub-carrier frequency.

Such a stereo receiver is disclosed in European Patent Application No. 0088 467. The bandpass filter comprised therein is a prerequisite for the stereo reception. The mixer comprised in this bandpass filter is constituted by a single mixer stage to which the output signal of the second low-pass filter is applied. The low-pass filter processes the output signal of a further mixer stage in which the output signal of the FM-demodulator is mixed with a square-wave signal of the sub-carrier frequency. This mixer operation converts the sidebands occurring in a stereo transmission at the output of the FM-demodulator and located on both sides of the (suppressed) sub-carrier to the low-frequency position. The resultant stereo-difference signal can be combined in a matrix circuit with the stereo-sum signal for the purpose of generating signals for the left and right channels. This stereo-difference signal is applied by the second low-pass filter to the mixer stage in the first mixer and again mixed there with a square-wave signal of the sub-carrier frequency. There is however a phase shift between this square-wave signal and the square-wave signal by means of which the sidebands are converted to the low-frequency position in the preceding mixer stage. This phase shift is necessary to ensure that the control loop formed by the oscillator of the mixer stage, the FM-demodulator and the first low-pass filter remains stable. In addition, the bandwidth of the sidebands is reduced by the low-pass filter.

The prior art stereo receiver has however the disadvantage that interference between audible when stereo signals are received. The invention has for its object to eliminate.

SUMMARY OF THE INVENTION

In a first way of accomplishing this object the non-sinusoidal signal applied to the first mixer is free from third and fifth harmonics of the sub-carrier frequency. In a second way of accomplishing the object the first mixer comprises a first mixer stage in which the output signal of the low-pass filter is mixed with a square-wave signal of the sub-carrier frequency, and at least two further mixer stages are provided in which the low-pass filter output signal is mixed with square-wave signals of three times, five times and optionally further odd multiples of the subcarrier frequency. The output signals of the further mixer stages are superposed on the output signal of the first mixer stage with such an amplitude and phase position that the mixing products contained in the output signal of the first mixer stage, which products have frequencies which are at least three times and five times the sub-carrier frequency, are at least partially compensated.

Both solutions are based on the recognition that the interference is caused by the fact that the oscillator is not only modulated with the wanted sidebands on both sides of the sub-carrier frequency, but also with further sidebands located on both sides of the third and fifth and possibly further odd harmonics of the sub-carrier frequency. These last-mentioned sidebands are produced because of the fact that the output signal of the second low-pass filter is mixed in the first mixer with a square-wave signal of the sub-carrier frequency. In addition to the first harmonic, this square-wave signal contains further odd harmonics, and the mixing products resulting from these higher harmonics, more specifically from the third and fifth harmonics, which consequently appear at the output of the first mixer may produce interference which falls within the useful signal range. In accordance with the first solution, these mixing products, and consequently also the interference falling within the useful signal range—are prevented by applying to the first mixer a signal which is at least free from third and fifth harmonics of the sub-carrier frequency, so that at the output of the mixer no mixing products with higher harmonics can occur—when the mixer is linear. The output signal of the mixer accurately corresponds to the product of the input signals.

In the second solution the unwanted mixing products with higher harmonics can indeed still appear at the output of the first mixer stage, but these mixing products are compensated for by the mixing products at the output of the further mixing stages.

It should be noted here that from German Patent Specification No. 2513228 it is known per se to compensate in a stereo receiver for the third harmonics contained in a square-wave signal of the sub-carrier frequency (38 kHz) by superposing on each other two square-wave signals having the sub-carrier frequency and being shifted 30° relative to each other. As a result thereof the interference produced by the third harmonic of the 38 kHz-square-wave signal will be eliminated, which always occurs when the received stereo transmitter is comparatively weak and a neighbouring transmitter is stronger. The higher-frequency modulation components of the strong transmitter are converted to the audible range by the third harmonic (at 140 kHz) of the subcarrier of the weak transmitter.

If, however, the above situation does not exist, that is to say the received transmitter is comparatively strong or there is no neighbouring strong transmitter, then this specific problem does not occur. For receivers of the type set forth in the opening paragraph this problem also does not occur, independent of the situation as regards the transmitters. The intermediate frequency is so low (for example 70 kHz) that the sidebands of strong transmitters in adjacent channels are substantially wholly suppressed. On the other hand the problem for which the invention solves, occurs only with stereo receivers of the type described in the opening paragraph, in which the tuning oscillator is modulated by the low-frequency baseband output signal, and not with conventional receivers such as, for example, the receiver shown in FIG. 1 of German Patent Specification No. 2513228, which do not modulate the oscillator frequency. This problem always occurs when stereo transmissions are received and is independent of the fact whether a stronger transmitter is present or not present in the neighbouring channel.

Consequently, the invention relates to stereo receivers of a type different from those disclosed in German Patent Specification No. 2513228 and the underlying problem is different from that of the prior art.

DESCRIPTION OF THE FIGURES

The invention will now be described in greater detail by way of example with reference to the accompanying drawings, in which.

DESCRIPTION OF THE PREFERRED EMBODIMENT

Figure 1:
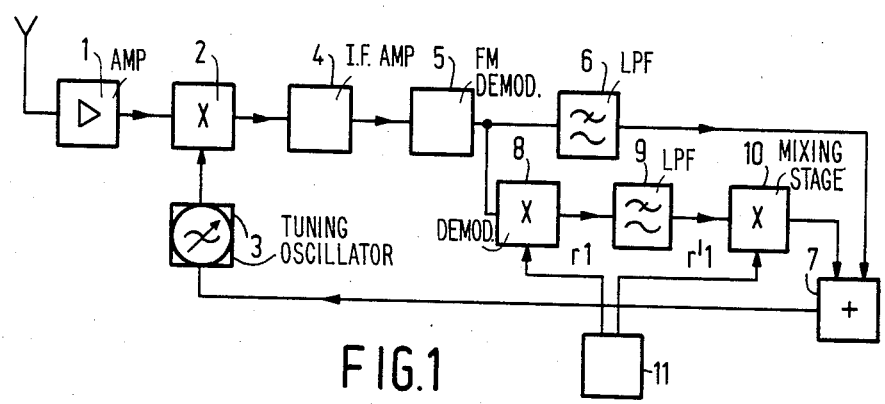
FIG. 1 shows a block circuit diagram of the prior art circuit.

With the prior art FM-stereo receiver shown in FIG. 1, the aerial signal is applied from an input amplifier 1 to a mixer stage 2, in which it is mixed with the aid of a frequency-controllable oscillator 3. The output signal of the mixer stage is applied through an intermediate-frequency amplifier 4 to an FM-demodulator 5, whose output signal is applied to one input of an adder circuit 7 by a first low-pass filter 6 and to a further input of the adder circuit by a bandpass filter 8-10. The bandpass filter 8-10 is formed by a demodulator 8 for producing a baseband stereo-difference signal on reception of a stereo-transmission, a second low-pass filter 9 and a first mixer stage 10. In the demodulator 8 the output signal of the FM-demodulator 5 is mixed with the square-wave signal r1 produced by a PLL-circuit 11. This results in the sidebands occurring on reception of stereo signals on both sides of the sub-carrier frequency (38 kHz) being converted to the low-frequency band, so that at the output of the demodulator 8 or at the output of the low-pass filter 9, which has the same cut-off frequency as the low-pass filter 6, the difference signal is produced which, as also holds for the sum signal at the output of the low-pass filter 6, can be applied to a dematrixing circuit, not shown further, which forms the signals for the right and left channels. The output signal of the low-pass filter 9 is applied to one input of the first mixer stage 10 at whose other input a square-wave signal r'1 is present which has the same frequency as the signal r1 but is phase-shifted relative thereto, by means of which the phase shifts produced in the preceding components, more specifically in the intermediate-frequency filter 4 and the FM-demodulator 5 are compensated.

The output signal of the adder circuit 7, which corresponds to the sum of the output signals of the low-pass filter 6 and the first mixer stage 10 is applied to the control input of the frequency-controllable oscillator 3.

Thus, the components 2 . . . 10 form a loop having a negative loop gain greater than unity (for example 4). This negative loop gain compresses the frequency deviation of the frequency-modulated signal coming from the input amplifier 1, for example in the ratio 1:5, so that it is possible to operate in a distortion-free manner with a very low intermediate frequency, for example 70 kHz. The receiver can consequently be constructed almost completely in an integrated circuit.

Figure 2A:
FIGS. 2a to 2e show frequency diagrams to explain the interference occurring in the receiver shown in FIG. 1.
Figure 2B:
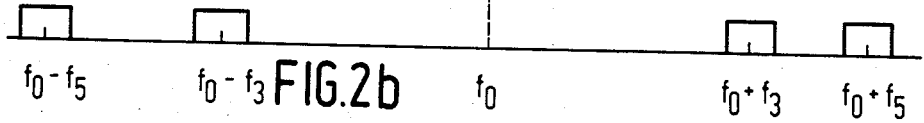

As mentioned in the foregoing, the low-frequency or baseband stereo-difference signal is mixed with the square-wave signal r'1 of the sub-carrier frequency in the first mixer stage 10. In addition to the desired sidebands (on both sides of the sub-carrier), unwanted mixing products—namely (interfering) sidebands—are produced in the output signal of the first mixer stage 10 on both sides of the third, fifth and higher odd harmonics due to the higher harmonics contained in the square-wave signal r'1. As the oscillator is also frequency-modulated with these unwanted mixing products, interfering sidebands appear also at its output. This is schematically shown in FIG. 2a, which illustrates the frequency spectrum of the oscillator signal. The mean frequency value with respect to time of this oscillator signal is denoted by $f_0$. The associated sideband is denoted by $s_0$, in the case of a stereo-transmission it corresponds to the sum signal for the right and left channels. At a frequency distance $f_1$ of the sub-carrier ($f_1 = 38$ kHz) there are an upper sideband $s_{+1}$ and a lower sideband $s_{-1}$, which on reception of a stereo signal correspond to the stereo difference signal. The sidebands $s_0$, $s_{-1}$ and $s_{+1}$ are required for a perfect reception. In addition to these desired sidebands there are, however, at a frequency distance $f_3 = 3f_1$, $f_5 = 5f_1$, that is to say always at an odd multiple of the sub-carrier frequency, further upper and lower sidebands which are designated by $s_{-3}$, $s_{+3}$, $s_{-5}$ and $s_{+5}$. The interfering sidebands, which are spaced by seven, nine, eleven times etc. the frequency from the oscillator frequency $f_0$, are not shown for the sake of clarity. FIG. 2b differs from FIG. 2a in that the useful sidebands $s_0$, $s_{+1}$ and $s_{-1}$ are omitted.

Figure 2C:
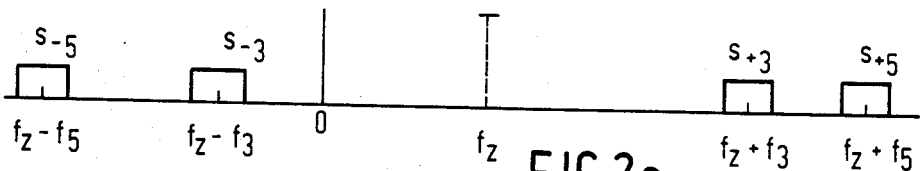
Figure 2D:
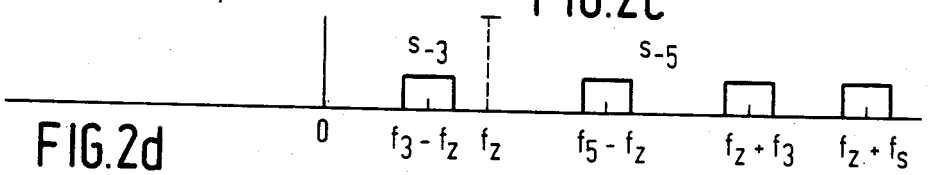
Figure 2E:
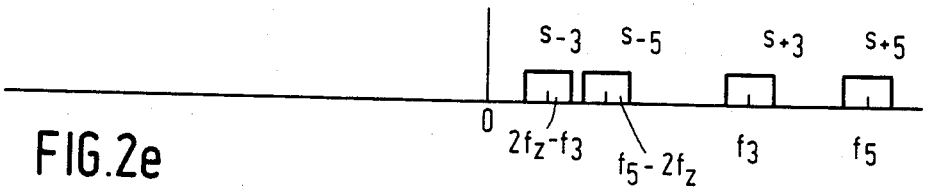

FIG. 2c shows the difference spectrum obtained when the carrier frequency at the output of the input stage 1 is subtracted from the noise spectrum (FIG. 2b). The oscillator frequency $f_0$ then changes into the intermediate frequency $f_z$. As the intermediate frequency is, however, relatively low (for example 70 kHz), the frequency zero line is located between the intermediate frequency $f_z$ and the lower interference sidebands $s_{-3}$ and $s_{-5}$. So these interference sidebands would be located in the negative frequency range. However, when they are mixed in the mixer stage 2, these interference sidebands are converted to the positive frequency range, that is to say they are mirror-invented around the frequency-zero line, so that the noise spectrum shown in FIG. 2d appears at the output of the mixer stage 2. The spectrum at the output of the FM-demodulator 5 differs by an amount $f_z$ from the spectrum shown in FIG. 2d. As $s_{-3}$ can however not be located in the negative frequency range it is again mirror-inverted around the frequency-zero line, so that the noise spectrum illustrated in FIG. 2e appears at the output of the FM-demodulator.

The lower interference sidebands $s_{-3}$ and $s_{-5}$ are then located in the frequency range which is also processed on reception of stereo signals. If, for example, the intermediate frequency is located at 70 kHz, the centre frequency of the interference sidebands $s_{-3}$ is at 26 kHz ($2 \times 70$ kHz $- 3 \times 38$ kHz) and the centre frequency of the interference sidebands $s_{-5}$ is at 50 kHz ($5 \times 38$ kHz $- 2 \times 70$ kHz). These interference sidebands $s_{-3}$ and $s_{-5}$ grouped around said frequencies are converted upon demodulation of the stereo difference signal to the lower frequency range and are particularly annoying to a listener.

Figure 3:
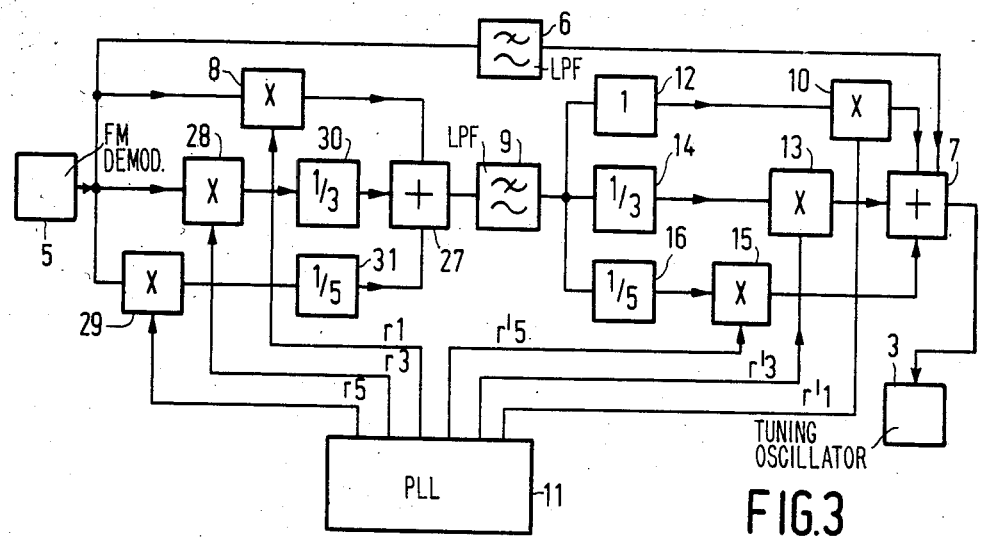
FIG. 3 shows a first embodiment of the invention.

The invention eliminates this interference by eliminating the unwanted mixing products which cause the interference sidebands, or by using signals during the mixing operation such that no unwanted mixing products can be produced. For the later solution it should be noted that fundamentally the unwanted mixing products can be eliminated by using a sinusoidal voltage of the sub-carrier frequency. Sinusoidal voltages can not be produced in an integrated circuit at a justifiable cost. A receiver according to the invention is identical to the receiver shown in FIG. 1. Only the bandpass filter 8, 9, 10 is different construction and only this portion is shown in FIG. 3 as a first embodiment of the invention.

The output signal of the low-pass filter 9 is applied to the input of each one of the mixer stages 10, 13 and 15 through three level adjusting elements 12, 14 and 16. These level adjusting elements are such that the amplitude of the signal applied to the input of the mixer stage 10 is three times larger than the amplitude of the signals at the input of the mixer stage 13 and five times larger than the amplitude at the input of the mixer stage 15. In the mixer stage 10 the signal is mixed with a square-wave signal r'1 having a frequency $f_1$ (38 kHz). A square-wave signal r'3 having a frequency $f_3$(114 kHz) is applied to the second input of the mixer stage 13 and a square-wave signal r'5 of five times the carrier frequency (190 kHz) is applied to the second input of the mixer stage 15.

Figure 6:
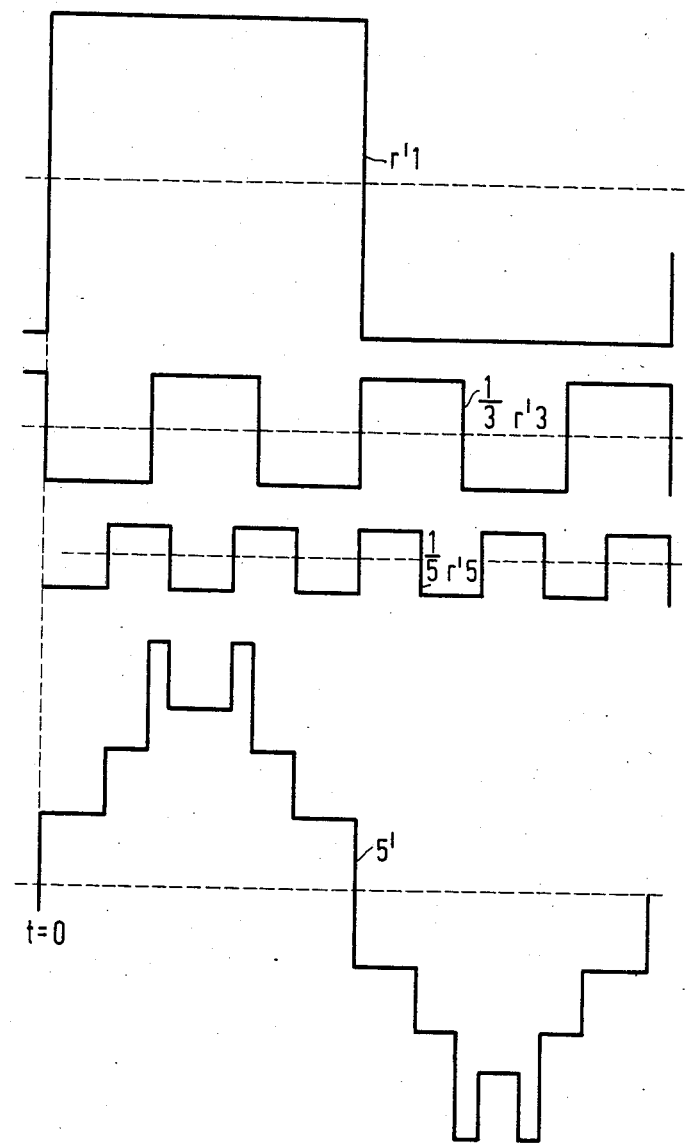

The variation in time of the square-wave signals r'1, r'3 and r'5 is illustrated by FIG. 6. All the square-wave signals are symmetrical, that is to say within one period there are only two signal states or voltage values, respectively which are mutually of equal durations and between which the signal alternates. The edges of the square-wave signal r'1 coincide in time with edges of the square-wave signals r'3 and r'5, always one positive (ascending) edge of the square-wave signal r'1 coinciding with negative edges of the signals r'3 and r'5 and a negative edge of the signal r'1 coinciding with positive edges of the signals r'3 and r'5, as is shown in FIG. 6.

The outputs of the mixer stages 10, 13 and 15 are connected to the inputs of the adder circuit 7.

To explain the effect of the invention let it be assumed that the mixer stages 10, 13, and 15 are all linear stages, that is to say that their output signal is proportional to the product of the input signals and that the difference signal f(t) is present at the output of the low-pass filter. Then the signal $$m_{10}=f(t)\cdot r'1(t) \quad (1)$$

is obtained at the output of the mixer stage 10.

The square-wave signal r'1(t) can be resolved in a Fourier-series:

$$r'1(t)=4a/\pi\cdot(\sin wt+(\sin 3wt)/3+(\sin 5wt)/5+\ldots) \quad (2)$$

Therein a is the amplitude of the square-wave signal and w the angular frequency of the sub-carrier. The first term in the expression between brackets then corresponds to the fundamental oscillation of the sub-carrier, which produces the desired mixing product, whereas the second and the subsequent terms correspond to the (odd) higher harmonics of the fundamental oscillation. If the seventh and all further higher harmonics are disregarded, then the signal $$m_{10}=f(t)\cdot 4a/\pi(\sin wt+(\sin 3wt)/3+(\sin 5wt)/5) \quad (3)$$

is obtained at the output of the mixer stage 10.

Similarly, the output signal $m_{13}$ at the output of the mixer stage 13 amounts to $$m_{13}=-f(t)/3\cdot 4a/\pi(\sin 3wt)+(\sin 9wt)/3+\ldots) \quad (4)$$

The minus sign is based on the fact that at time t=0 the negative portion of the signal r'3 starts. In a corresponding way, the output signal $m_{15}$ at the output of the mixer stage 15 amounts to $$m_{15}=-f(t)/5\cdot 4a/\pi\cdot(\sin 5wt+(\sin 15wt)/3a\ldots) \quad (5)$$

Adding together the output signals of the three mixer stages results for $m_7$ in that $$m_7=f(t)\cdot 4a/\pi\cdot\sin wt \quad (6)$$

It will be obvious that the mixing products related to the third and fifth harmonics, have disappeared and only mixing products of the seventh and higher harmonics remain. Should these harmonics still be annoying they could be eliminated in a similar way using square-wave signals of the seven times higher frequency of the sub-carrier oscillation or a still higher frequency, respectively.

It will be clear from the foregoing that the level adjusting elements may alternatively be arranged subsequent to the mixer stages; for linear mixer stages the square-wave signals may alternatively be applied to the control elements through the mixer stages. It is also not of fundamental importance that the output signals of the mixer stages are added together, because when the positive edges of the square-wave signal r'1 always coincide with positive edges of the signals r'3 and r'5 the unwanted mixing products are eliminated when the output signals of the mixer stages 13 and 15 are subtracted from the output signal of the mixer stage 10.

Figure 4:
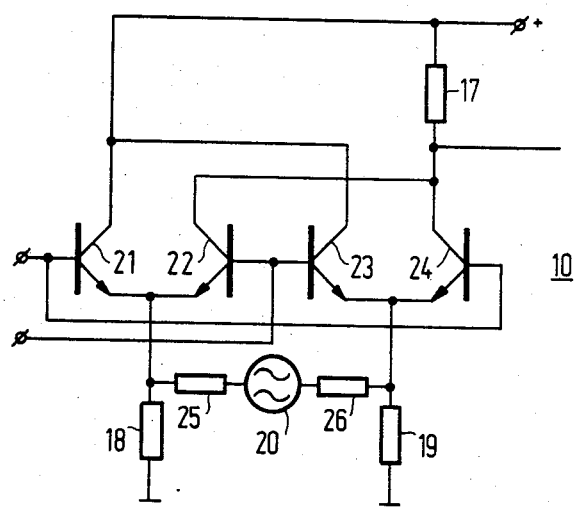
FIG. 4 shows the construction of a mixer stage suitable for use therein.

FIG. 4 shows an embodiment of a suitable mixer stage. It comprises a first pair of transistors 21, 22 whose emitter electrodes are interconnected and a second pair of transistors 23, 24, whose emitter electrodes are also interconnected. The base-electrodes of the transistors 22 and 23 and those of the transistors 21 and 24 on the other hand are interconnected. Likewise the collectors of the transistors 21 and 23 and the collectors of the transistors 22 and 24 are mutually interconnected. A resistor 17 from which the output signal can be taken off is in the collector path of both transistors 22 and 24. The respective emitter direct currents for the pairs of transistors 21, 22 and 23, 24, is determined by resistors 18 and 19, which respectively connect the emitter electrodes of the pairs of transistors 21, 22 and 23, 24 to ground. The emitter alternating current is produced by a voltage source 20 which through resistors 25 and 26, respectively is connected to the respective pairs of transistors 21, 22 and 23, 24 and applies in anti-phase a signal corresponding to the output signal of the low-pass filter 9 to these pairs of transistors.

As the resistors 25 and 26, which have equal values, determine the emitter alternating current, it is efficient to make these resistors for the mixer stage 15 five times larger (and for the mixer stage 13 three times larger) than for the mixer stage 10, so that the emitter-alternating currents for the mixer stages 10, 13 and 15 would be in a ratio 1:3:5 so that the level adjusting elements 12, 14, 16 would become superfluous. A further feature of the shown mixer stage is that the output signal at the collector resistor 17 is only proportional to the signal of the signal source 20, and not proportional to the voltage between the base electrodes which are used as the inputs for the specific square-wave signal, if the square-wave signals have an amplitude which is sufficient for cutting-off either the transistors 22, 23 or 23, 24. Inspite of this, the desired mixing products are obtained when the amplitude of the square-wave signals applied to the base electrodes is chosen to be so large that the transistors 21, 24 and 22, 23 are alternately turned on and off. The three mixer stages together require only one output resistor 17 from which then the output signal from which the third and fifth harmonics of the carrier frequency have been removed can be taken off.

Fundamentally, as also holds for the prior art receiver shown in FIG. 1, it is possible to use an an input signal for the low-pass filter 9 the outut baseband stereo-difference signal of the preceding demdodulator 8, which is obtained by mixing the output signal of the FM-demodulator 5 with a square-wave signal r1 of the carrier frequency, the phase of this square-wave signal being shifted relative to the square-wave signal r'1. In the embodiment shown in FIG. 3, the output signal of a mixer stage functioning as the demodulator 8 is applied to the low-pass filter 9 by an adder circuit 27 in which the output signals of further mixer stages 28 and 29 are added to the output signal of the mixer stage 8, these output signals of the further mixer stages 28 and 29 being applied to the inputs of the adder circuit 27 through circuits 30 and 31 in which the output signal of the mixer stages are reduced to one-third or one-fifth. In the mixer stages 28 and 29 the output signals of the FM-demodulator 5 are mixed with square-wave signals r3 and r5 having thrice or five times the frequency of the subcarrier. The square-wave signals r1, r3 and r5 have mutually phase positions as have also the signals r'1, r'3 and r'5 (cf. FIG. 6).

The additional mixer stages 28 and 29 and the subsequent adding operation have for their object to eliminate the mixing products which are obtained when an interference signal having a frequency which is approximately three times and five times larger than the subcarrier frequency occurs at the input of the mixer stage 8 which is connected to the output of the FM-demodulator 5. These interference signals are converted to the low-frequency range by mixing them with the harmonics contained in the square-wave signal r1 and consequently can not be eliminated by the low-pass filter 9. Cancelling these unwanted mixing products is effected in the way described with reference to the mixer stages 10, 13 and 15.

The PLL-circuit 11 which produces the square-wave signals r1, r3, r5 and r'1, r'3 and r'5, advantageously comprises an oscillator which oscillates at fifteen times the sub-carrier frequency or a multiple thereof, for example at 4.56 MHz. To realize the required phase differences (between r1, r'1 and r3, r'3, respectively or r5, r'5) an appropriate phase shifting member may be provided, and the required frequency can be derived fron the oscillator frequency with the aid of frequency dividers.

Figure 5:
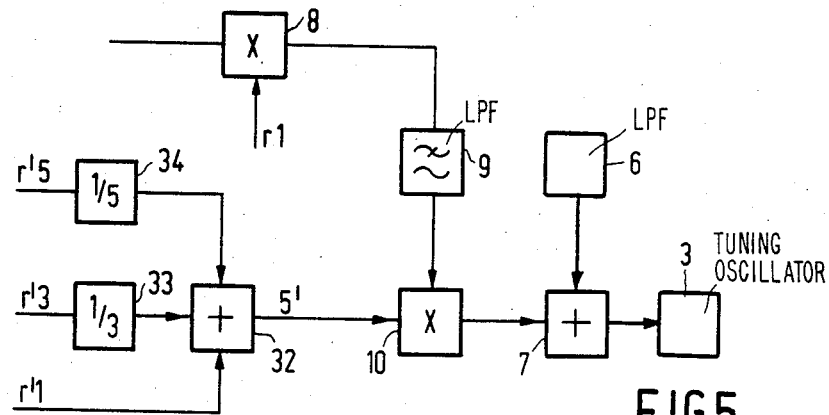
FIG. 5 shows a portion of a different embodiment according to the invention and FIG. 6 shows the variation in time of different signals in the embodiments according to the invention.

In the embodiment shown in FIG. 3 unwanted mixing products are indeed produced at the output of the mixer stage 10 in the range of the third and fifth harmonics, but these mixing products are compensated for by equally large mixing products of inverted polarities at the output of the mixer stages 13 and 15. In contrast therewith, FIG. 5 shows an embodiment in which the mixing products of the third and fifth harmonics can even be avoided, since the output signal of the low-pass filter 9 is mixed in the mixer stage 10 with a non-sinusoidal signal of the carrier frequency which is free from third and fifth and also even harmonics. A method of producing such a signal is disclosed in German patent application P No. 3311072, in which the sinusoidal variation is approximated piece by piece by straight lines with a predetermined slope.

In the embodiment shown in FIG. 5 the signal from which the even and third and fifth harmonics have been removed and which has the carrier frequency is, however, produced in a different way. The square-wave signal r'1 is then applied to the first input of an adder circuit 32, a second input of the adder circuit 32 receives via a level adjusting element 33 the signal r'3 with a three times larger frequency, and one third of the amplitude of r'1, whilst a third input of the adder circuit 32 receives the square-wave signal r'5 through a level adjusting element 34 with a five times larger frequency and one-fifth of the amplitude of r'1. The variation with time of the square-wave signals at the three inputs of the adder circuit 32 is shown in FIG. 6 and also the resultant sum signal s'.

This sum signal s' contains, besides the fundamental wave, no even harmonics and only the seventh and higher odd harmonics. The third and fifth harmonics have been suppressed. As a result thereof absolutely no mixing products with third and fifth harmonics occur at the output of the mixer stage 10. As the mixer stage 10 must operate in the linear mode, a mixer stage must be used whose output signal changes proportionally to the product of the input signals, such as a multiplying stage, for example.

What is claimed is:

1. An FM-stereo receiver comprising:
  a frequency controlled oscillator having a control input for receiving a frequency control voltage;
  means for mixing a received radio frequency input signal with a signal from said oscillator, whereby an intermediate frequency signal is produced;
  an FM demodulator for demodulating said intermediate frequency signal;
  means for deriving a control voltage for said oscillator from a demodulated signal produced by said FM demodulator comprising a first low pass filter, and bandpass filter connected in parallel with said low pass filter to receive said demodulated signal, said bandpass filter including a stereo signal demodulator for producing a stereo difference signal when a stereo signal is included in said radio frequency input signal, a second low pass filter for supplying said stereo difference signal to a first mixer stage, said first mixer stage receiving a second, non-sinusoidal signal having a frequency of a subcarrier frequency of said stereo difference signal; and
  means responsive to said first low pass filter and an output of said first mixer for removing mixing products produced by third and fifth harmonics of said non-sinusoidal signal fundamental frequency from said first mixer stage output signals, to thereby generate said control voltage.

2. The receiver of claim 1 wherein said means for removing mixing products comprises means for producing said non-sinusoidal signal as a combination of first, second and third square wave signals having a frequency of the fundamental, third and fifth harmonic frequencies of said subcarrier frequency, said first, second and third signals having an amplitude and phase relationship which suppresses undesired mixing products produced by said first mixer stage.

3. An FM-stereo receiver comprising:
a frequency controlled oscillator having a control input for receiving a frequency control voltage;
means for mixing a received radio frequency input signal with a signal from said oscillator, whereby an intermediate frequency signal is produced;
an FM demodulator for demodulating said intermediate frequency signal;
means for deriving a control voltage for said oscillator from a demodulated signal produced by said FM demodulator comprising:
a first low pass filter connected to receive said demodulated signal;
a stereo difference signal demodulator connected to receive said demodulated signal and provide a stereo difference signal;
a second low pass filter connected to receive said stereo difference signal;
first, second and third mixer stages for receiving a signal from said second low pass filter, and for receiving respectively, first second and third square wave signals having frequencies which are, respectively, the fundamental, third and fifth harmonics of a subcarrier frequency associated with said stereo difference signal;
means for combining output signals from said first, second and third mixer stages in an amplitude and phase relationship for suppressing undesired mixing products from said first mixer stage which are harmonically related to said subcarrier; and,
an adder for producing said control voltage from a signal from said means for combining and a signal from said first low pass filter.

4. A receiver according to claim 3 wherein said stereo signal demodulator comprises fourth, fifth and sixth mixer stages connected to mix a signal from said FM demodulator with fourth, fifth and sixth signals having a frequency which are, respectively, the fudndamental, third and fifth harmonic of said subcarrier frequency; and
means for combining output signals from said fourth, fifth and sixth mixer stages in an amplitude and phase relationship for suppressing mixing products of the third and fifth harmonics of said subcarrier frequency.

5. A receiver as claimed in claims 2 or 3 characterized in that the square-wave signals are derived with frequency dividers from an oscillator whose frequency is five times the sub-carrier frequency or a multiple thereof.

* * * * *